US006707912B2

(12) United States Patent
Stephens et al.

(10) Patent No.: US 6,707,912 B2
(45) Date of Patent: *Mar. 16, 2004

(54) METHOD AND APPARATUS FOR SETTING A STEP SIZE FOR AN ADAPTIVE FILTER COEFFICIENT OF AN ECHO CANCELLER

(75) Inventors: James Allen Stephens, Chandler, AZ (US); James Brian Piket, Gilbert, AZ (US); Ernest Pei-Ching Chen, Gilbert, AZ (US); William Chunhung Yip, Phoenix, AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/266,280

(22) Filed: Mar. 11, 1999

(65) Prior Publication Data

US 2002/0090079 A1 Jul. 11, 2002

(51) Int. Cl.[7] ............................................. H04M 9/08
(52) U.S. Cl. ..................... 379/406.08; 379/406.02; 379/406.07; 379/406.01; 379/406.09; 379/406.05; 379/406.1
(58) Field of Search ................. 379/400–409, 379/410–411, 406.01–406.16; 381/71.1–71.14, 71.01

(56) References Cited

U.S. PATENT DOCUMENTS

| | | | | |
|---|---|---|---|---|
| 4,783,818 A | * | 11/1988 | Graupe et al. | |
| 4,894,820 A | * | 1/1990 | Miyamoto et al. | 370/32.1 |
| 5,022,082 A | * | 6/1991 | Eriksson et al. | |
| 5,475,731 A | * | 12/1995 | Rasmusson | 379/3 |
| 5,764,753 A | * | 6/1998 | McCaslin et al. | 379/389 |
| RE35,867 E | * | 8/1998 | Sugiyama | |
| 5,859,907 A | * | 1/1999 | Kawahara et al. | 379/410 |
| 5,933,494 A | * | 8/1999 | Yang et al. | 379/410 |
| 5,951,626 A | * | 9/1999 | Duttweiler | |
| 6,061,444 A | * | 5/2000 | Kawahara et al. | 379/410 |
| 6,081,593 A | * | 6/2000 | Kim | 379/410 |
| 6,147,979 A | * | 11/2000 | Michel et al. | |
| 6,421,326 B1 | * | 7/2002 | Lee et al. | |

FOREIGN PATENT DOCUMENTS

| | | |
|---|---|---|
| EP | 0023056 | 1/1981 |
| EP | 0708536 | 4/1996 |
| EP | 0856834 | 8/1998 |
| JP | 070193529 | 7/1995 |

OTHER PUBLICATIONS

Duttweiler, "Propotionate Normalized Least–Mean–Squares Adapataion in Echo Canclellers", 2000, IEEE Trans. on Speech an Audio Processing, vol. 8, No. 5, Sep. 2000; pp. 508–518.*

Exponentially Weighted Stepsize NLMS Adaptive Filter Based on the Statistics of a Room Impulse Response, Shoji Makino, Member, IEEE, Yutaka Kaneda, Member, IEEE and Nobuo Koizumi, IEEE Translations on Speech and Audio Processing, vol. 1, No. 1, Jan. 1993.

* cited by examiner

Primary Examiner—Fan Tsang
Assistant Examiner—Ramnandan Singh
(74) Attorney, Agent, or Firm—Randall S. Vaas

(57) ABSTRACT

The step sizes for tap positions of an adaptive filter (124) in an echo canceller (125) for canceling an echo signal are individually selected based upon a profile of the echo environment. A training signal (112) is injected into the echo canceller and to the echo path during a training interval, or period. The adaptive filter profiles the echo path during the training interval. Respective step sizes α[k] for the tap positions are generated as a function of the echo profile so generated.

19 Claims, 2 Drawing Sheets

METHOD AND APPARATUS FOR SETTING A STEP SIZE FOR AN ADAPTIVE FILTER COEFFICIENT OF AN ECHO CANCELLER

FIELD OF THE INVENTION

The present invention pertains to echo cancellers, and more particularly to an adaptive step-size thereof.

BACKGROUND OF THE INVENTION

Operation of bi-directional hands-free communication devices, such as two-way radios, speaker phones which are commonly referred to as hands-free telephones, teleconferencing devices and car-kits for cellular telephones, requires management of those signals emitted by an audio speaker that are coupled to a microphone. Such devices are utilized in systems having a communication channel, such as a cable, twisted-wire, optical fiber, a frequency bandwidth for signals transmitted by air, or the like, which connects a local, or "near-end," device to a remote, or "far-end," device. Signals output by the speaker of a device that are detected by the microphone of the device are commonly called echoes. Echoes which occur at one end of the communication link are generally a nuisance to users at the other end. In severe cases, echoes can result in a phenomena known as "howling" which is very unpleasant at both ends of a communication link.

Echo cancellers have been developed to cancel echo signals. Echo cancellers employ a filter to estimate the echo signal in a communication device. The echo canceller subtracts the echo estimate from the signal output by the microphone to produce an echo suppressed signal.

Although echo cancellers work well in some environments, the effective cancellation of echo signals in a hands-free vehicle environment is particularly challenging. Least means squares (LMS) error minimization recursive filters are often used for echo control. Although these filters are very stable, nonlinear system effects, as well as limitations of algorithmic and arithmetic precision, limit the effectiveness of echo cancellers incorporating such filters. Post processing stages are thus employed to suppress residual echoes. Post processing can include attenuation of the output signal using a variable gain control or a filter, or other known post processing techniques.

Unfortunately, post processing can result in significant degradation and attenuation of desired transmission signals that are present when both users are speaking simultaneously (double talk condition). For example, post processing attenuation can result in the echo canceled taking on half-duplex characteristics, such that only one user can speak at a time. Additionally, post processing typically introduces perceptible changes, or attenuation, of the background noise, which is present in noisy environments such as vehicle interiors. When this noise variation correlates with speech activity in the signal received at the far end, it is objectionable to far-end users.

A variety of methods have been developed to improve echo canceller performance. Such methods include storing initial tap values for the echo canceller. Storing such initial tap values may speed up echo canceller operation upon initialization. However, if the present initial conditions are dramatically different from the previous initial conditions, starting from the previous conditions will not be beneficial.

Another known method of improving echo canceller operation employs an adaptive step size, such that the error signal gain fed back to the adaptive filter is varied as a function of the magnitude of the error signal. If the error signal is large, the step size will be large. If the error signal is small, the step size is small. Although echo cancellers operating in this manner provide improved performance by adapting more quickly, the echo canceller adaptation must still occur without having initial state unique to the environment of the echo canceller.

Accordingly, there is a need or an improved echo canceller to provide more rapid convergence based upon the environment of the echo canceller.

DETAILED DESCRIPTION OF THE DRAWINGS

The step size for tap positions of an adaptive filter in an echo canceller for canceling an echo signal are individually selected based upon a profile of the environment. A training signal is injected into the echo canceller and to the echo path during a training interval, or period. The adaptive filter profiles the echo path during the injection of the training signal. Respective step sizes for the coefficients are generated as a function of the echo profile so generated. The step sizes for individual taps are thus generated as a function of the coefficients, such that tap positions which are expected to have large magnitudes will have a large step size permitting rapid adaptation whereas tap positions which are expected to have small coefficients will have small step sizes permitting accurate adaptation.

Figure 1:
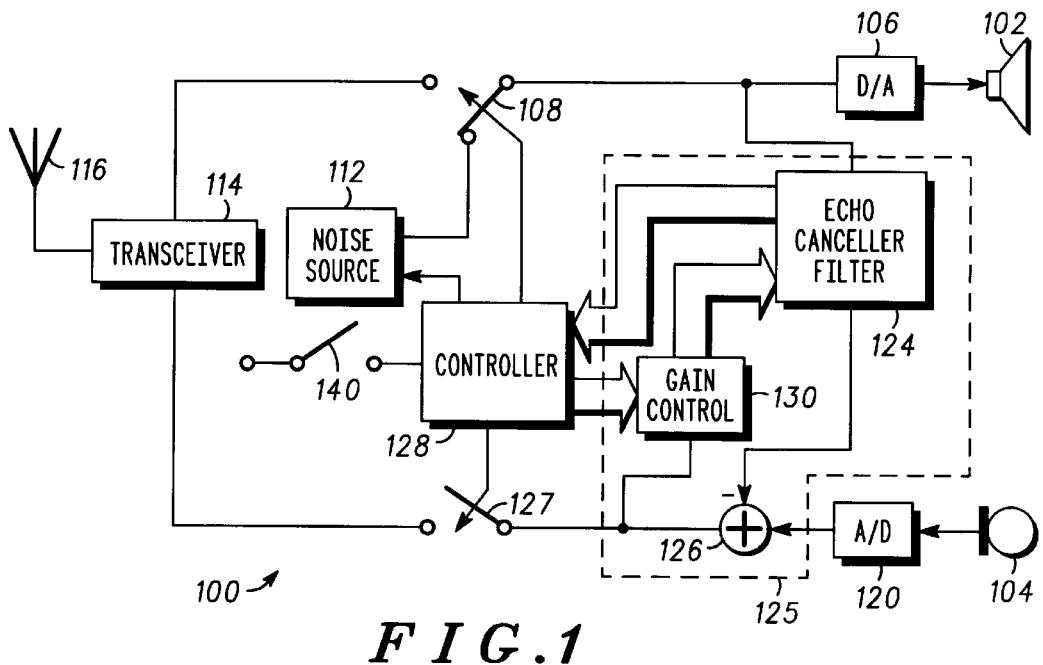
FIG. 1 is a circuit schematic in block diagram form illustrating a communication device including an echo canceller.

A communication device 100 is shown in FIG. 1. The communication device 100 can be a two-way radio, a speaker phone which are commonly referred to as hands-free telephones, a teleconferencing device, a portable radiotelephone, a satellite telephone, a car-kit for a cellular telephone, or the like.

The communication device includes a loudspeaker 102 and a microphone 104. The loudspeaker 102 is connected to the receive path of device 100, which receive path includes a digital-to-analog (D/A) converter 106 connected to a switch 108. The switch 108 selectively connects the D/A converter 106 to receive signals from either a noise source 112 or the receiver (not shown) of a transceiver 114. The transceiver 114 communicates signals received from a remote communication device via antenna 116 for output to the speaker 102. The noise source 112 generates digitized training signals, and may for example generate a random signal, white noise or any other suitable training signal.

The microphone 104 is coupled to the transmit path of the communication device 100. The communication device 100 transmit path includes an analog-to-digital (A/D) converter 120, which outputs digitized representations of the analog signal from microphone 104. The signal output from the A/D converter 120 is combined with the output of an echo canceller 125 adaptive filter 124 in subtractor 126. The subtractor subtracts the echo estimate output of the adaptive filter 124 from the output of the A/D converter 120 to generate a substantially echo-free signal at the output of the subtractor.

The subtractor is connected to a switch 127 controlled by a controller 128. The controller 128 connects the output of the subtractor to the transceiver at all times except when the noise source generator 112 is connected to the D/A converter 106 during a training mode. This permits the adaptive filter to be trained without feeding noise to the transceiver 114, which communicates with a far-end, or remote, party.

The controller 128 is also connected to receive coefficients from the adaptive filter 124 and provide gain control signals to a gain control 130. The gain control 130 adjusts the adaptation step size individually for each tap, or coefficient, of the echo canceller as described hereinbelow.

Training may be initiated upon installation of the device 100, by the user actuating a manual switch 140 (FIG. 2), or automatically on a periodic basis. It is envisioned that the user could initiate training by actuating switch 140 if they move the location of the microphone 104 and/or speaker 102 in a vehicle installation. Alternatively, if the hands-free unit is in a portable telephone the user could initialize the device each time the phone is cradled in a vehicle, or the switch 140 could be actuated only the first time that a phone is installed in a permanent location. Alternatively, the controller 128 can automatically enter training mode, for example on a periodic basis.

Figure 2:
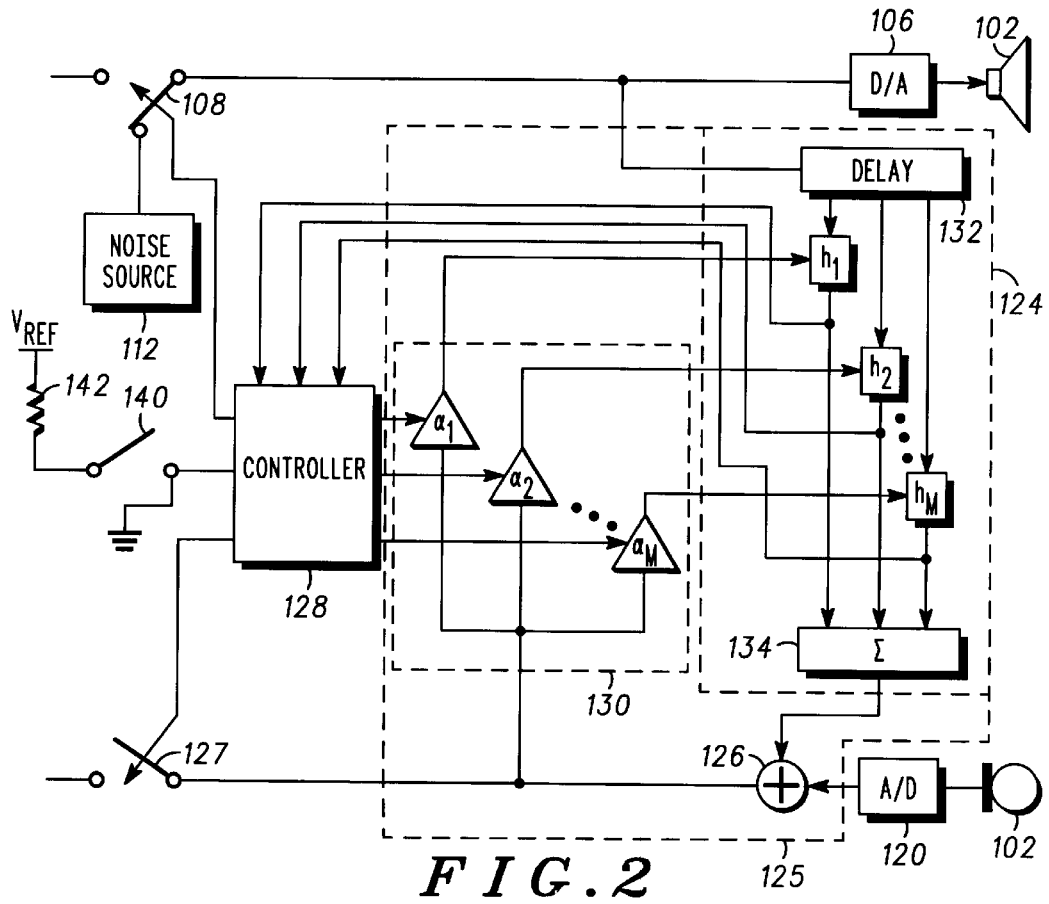
FIG. 2 is a circuit schematic in block diagram form illustrating an echo canceller.

With reference to FIG. 2, during the training mode, switch 108 is connected to a noise signal generator 112, which generates a signal used to train the echo canceller, such as white noise as mentioned above. The second switch 127 is open. The standard least mean square (LMS) algorithm used for updating coefficients of an adaptive filter is given in equation 1, wherein $h_n[k]$ represents the coefficient at the kth tap position of the adaptive filter at sample time n (h[1] for the first tap position, h[2] for the second tap position, and h[M] for the Mth tap position where the adaptive filter has M taps at the output of shift register 132), fixed parameter α is the step size constant (much less than 1), $x_n$ is the received signal, e is the error signal output from the subtractor 126, and c is a constant having a value significantly smaller than the expected value of $|x_n|$:

$$h_n[k] = h_{n-1}[k] + (\alpha/(\|x_n\| + c))e_n x_{n-k}. \quad (1)$$

During the training mode, the same predetermined step size α is used for all of the coefficients.

In the echo cancelling mode, switch 108 is connected to the receiver of transceiver 114 and switch 127 is connected to output a signal to the transmitter of transceiver 114. In the echo profiling system, the step size constant α[k] is a function of the tap position as determined in the training mode and shown in the following equation:

$$h_n[k] = h_{n-1}[k] + (\alpha_k[k]/(\|x_n\| + c))e_n x_{n-k}. \quad (2)$$

The step size for a particular tap position is selected as a function of the value of the coefficients near that tap position generated during training. Thus, the step size for the nth tap will be the derived from a set of coefficients centered about the nth tap at the end of the training interval. By using the coefficients derived during the training mode, taps near large coefficients will have a large step size and taps not near large coefficients will have a small step size. This increases the efficiency of the echo canceller and improves the accuracy of the echo estimate using information derived from the environment in which the echo canceller is employed.

Figure 3:
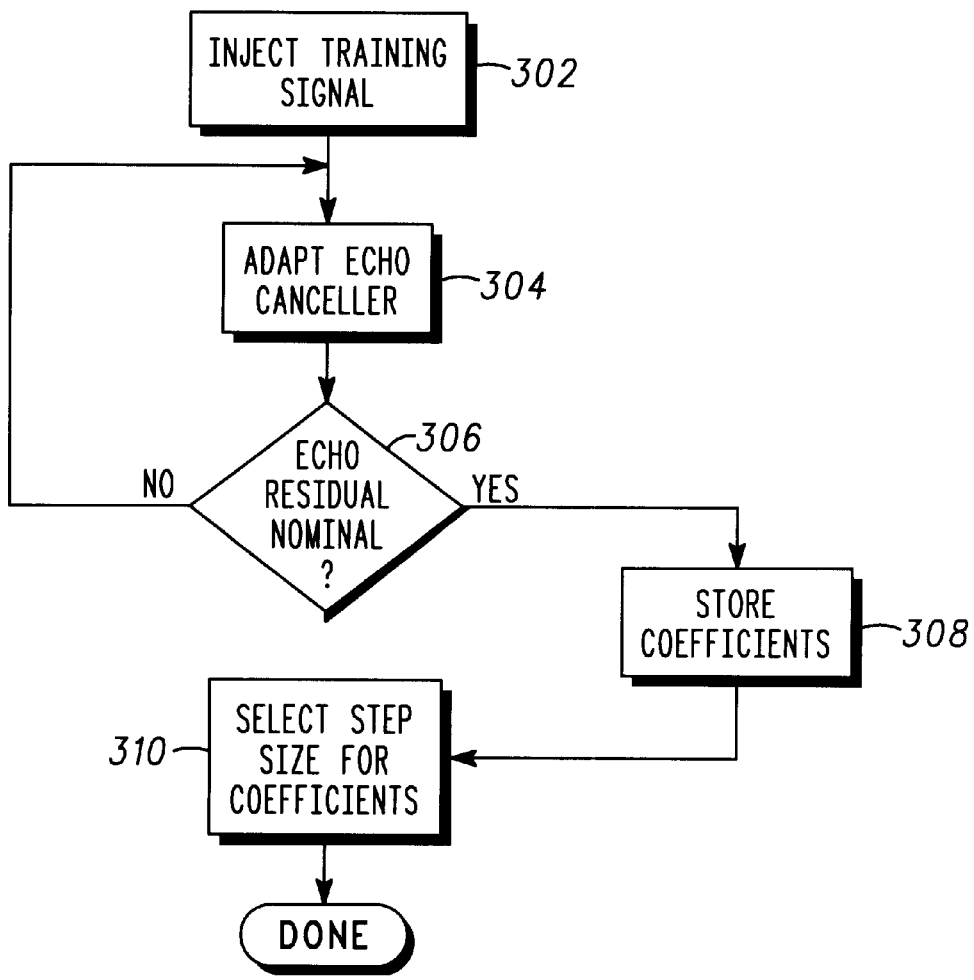
FIG. 3 is a flow chart illustrating operation of the echo canceller.

As mentioned briefly above, the step size α[k] is generated independently for each tap of the adaptive filters using the following method. First, during a training period, a training signal is injected as indicated in block 302 of FIG. 3. A standard least means square (LMS) algorithm is used in filter 124 during a training period in which the coefficients h[n] of filter 124 are adapted using a single common step size α, as indicated in block 304. Adaptation will continue until the echo residual signal drops below a predetermined threshold level as indicated in step 306. Alternatively, the adaptation can take place for a predetermined time period, such as an expected training period. The value of the coefficients h[n] at the end of the training period are input to the controller 128. These coefficients are stored, as indicated in step 308, and the stored impulse response estimates are referred to as h'[n].

The impulse response h'[n] is used to generate the echo profile vector as indicated in step 310. Although the respective step sizes for the tap positions can be set based on many estimation techniques, the step sizes are preferably generated using a sum of coefficients, and most preferably from a sum of adjacent coefficients. By using a sum of adjacent coefficients, the step size is generated based on an average level rather than a single step size.

A particularly advantageous method of generating the respective step sizes for the tap positions of the echo canceller is described herein below. First a sum is generated from adjacent coefficients, wherein α'[k] is the:

$$\alpha'[k] = \sum_{j=K-3}^{j=K+3} |h'[j]| \quad h'[j] = 0 \; n > M \; \text{or} \; n < 0. \quad (3)$$

Coefficient values at the ends of the adaptive filter are thus given a value of zero for purposes of calculating the coefficient step sizes whereas coefficients within the adaptive filter have the values stored at the conclusion of training. Each summation is then divided by the maximum summation $\max(\alpha'(k))$, such that:

$$\alpha[k] = (2\alpha'[k])/(\max(\alpha'(k))). \quad (4)$$

By dividing the summation by the maximum summation, the step sizes are scaled to a maximum value of 2 to provide stability.

In the echo canceling mode, the finite impulse response (FIR) filter 124 coefficients $h_1$ to $h_N$ are adapted using the coefficients generated during training, and thus are related to the profile information from the training mode. In this manner, the adaptation of the echo canceller coefficients is expedited using information unique to the environment where the echo canceller is located. Those coefficients in a range of coefficients producing a summation with a large value during profiling will produce a proportionally large step size. Those coefficients in a range of coefficients producing a summation with a proportionally small value, will have a proportionally small step size.

Echo profiling of the acoustic environment of echo canceller 124 during a training mode is thus used to initialize step size in gain control 130 on a tap-by-tap basis. This system operates in two modes, a training mode and a canceling mode. The training mode may take only a few seconds during installation of device 100 in an environment, such as a vehicle or a room, or upon user actuation of switch 140. Other than during such brief training mode, the canceling mode is used.

A hands-free telephone can comprise a microphone, a speaker and the echo canceller. The echo canceller attenuates echoes of signals output by the speaker and detected by the microphone. It includes adaptive coefficients having respective step sizes, each step size being a function of an associated coefficient value of the echo canceller generated during training. The hands-free telephone can advantageously include at least one switch for enabling training of the echo canceller to generate the associated coefficients representative of an environment in which the hands-free telephone will operate.

Thus it can be seen that an improved system is disclosed that provides better performance than prior systems, while maintaining the low complexity and stability of the LMS adaptive filter. When employed in a hands free telephone, and particularly a portable telephone such as a wireless hands-free telephone, an effective and efficient method of adaptation is provided for the environment where the telephone is used.

What is claimed is:

1. A method of setting a plurality of step sizes for a plurality of filter coefficients of an adaptive filter in an echo canceller for canceling an echo signal communicated through an echo path, the method comprising the steps of:

profiling in a training mode, with an adaptive filter, the echo path responsive to a training signal by adaptively adjusting respective filter coefficients and producing as a function of the respective filter coefficients an estimate of an echo signal of the training signal; and selecting respective step sizes for respective ones of the filter coefficients in a canceling mode as a function of the respective ones of the filter coefficients generated in the training mode.

2. The method of claim 1, further including the step of injecting white noise to the echo canceller and the echo path in the training mode.

3. The method of claim 1, wherein the step of profiling the echo path in the adaptive filter responsive to the training signal includes adapting the respective filter coefficients to cancel the echo of the training signal.

4. The method of claim 1, wherein the step of profiling the echo path in the adaptive filter responsive to the training signal includes using a predetermined step size for each of the respective ones of the filter coefficients during the training mode.

5. The method of claim 1, wherein the step of selecting respective step sizes includes for a first step size associated with a first filter coefficient, adding other filter coefficients to said first filter coefficient to produce a sum and generating said first step size as a function of said sum.

6. The method of claim 5, wherein the step of selecting respective step sizes includes for a second step size associated with a second coefficient, adding other filter coefficients to said second coefficient to produce a sum and generating said second step size as a function of said sum.

7. The method of claim 1, wherein the step of selecting respective step sizes includes adding filter coefficients to the respective coefficients to produce respective sums and generating respective step sizes as a function of the respective sums.

8. The method of claim 7, further including the step of dividing the respective sums by at least one of the respective sums.

9. The method of claim 7, further including the step of dividing each of the respective sums by a largest one of the sums.

10. The method of claim 7, wherein each of the respective sums is a sum of adjacent filter coefficients.

11. The method of claim 7, wherein the respective sums are generated according to the following equation:

$$\alpha'[k] = \sum_{j=K-3}^{j=K+3} |h'[j]| \quad h'[j] = 0 \; n > M \text{ or } n < 0$$

wherein $\alpha'[k]$ represents a step size $\alpha$ at a tap position k, h'[j] is the impulse response coefficients of the adaptive filter generated during the training mode, M is the number of coefficients in the adaptive filter, and n represents coefficient values.

12. The method of claim 11, further including the step of calculating the respective step sizes $\alpha[k]$ according to the following equation:

$\alpha[k]=(2\alpha'[k])/(\max((\alpha'(k))$ wherein $\alpha'[k]$ represents a step size $\alpha$ at a tap position k.

13. An echo canceller adaptive filter including a plurality of filter coefficients for generating an echo estimate for canceling an echo signal communicated through an echo path, comprising:

a plurality of adaptive coefficient circuits generating the filter coefficients;

a plurality of step size circuits associated with the adaptive filter coefficient circuits and individually controlled to have respective step sizes for the respective coefficient circuits; and a control circuit coupled to the coefficient circuits and to the step size circuits for setting the step sizes as a function of respective coefficients of the respective coefficient circuits wherein the control circuit includes an adder for adding filter coefficients to respective coefficients to produce respective sums and generating each respective step size as a function of a respective sum.

14. The echo canceller of claim 13, wherein the control circuit includes a divider for dividing the respective sums by at least one of the sums.

15. The echo canceller of claim 13, further including the step of dividing each of the respective sums by a largest one of the sums.

16. The echo canceller of claim 13, wherein the respective sums are generated according to the following equation:

$$\alpha'[k] = \sum_{j=K-3}^{j=K+3} |h'[j]| \quad h'[j] = 0 \; n > M \text{ or } n < 0$$

wherein $\alpha'[k]$ represents a step size $\alpha$ at a tap position k, h'[j] is the impulse response coefficients of the adaptive filter generated during the training mode, M is the number of coefficients in the adaptive filter, and n represents coefficient values.

17. The echo canceller of claim 16, wherein the respective step sizes $\alpha[k]$ are generated according to the following equation:

$\alpha[k]=(2\alpha'[k])/(\max(\alpha'(k))$ wherein $\alpha'[k]$ represents a step size $\alpha$ at a tap position k.

18. A handsfree telephone comprising:
a microphone;
a speaker; and
an echo canceller coupled to the microphone and the speaker for canceling an echo from the speaker output by the microphone, the echo canceller including an adaptive filter for generating an echo estimate for canceling the echo, the adaptive filter including:

a plurality of adaptive coefficient circuits having respective coefficients;

a summer for summing outputs of the coefficient circuits to produce an echo estimate; and a plurality of step size circuits associated with the adaptive coefficient circuits and individually controlled to have respective step sizes for the respective coefficient circuits, wherein respective sums are generated according to the following equation:

$$\alpha'[k] = \sum_{j=K-3}^{j=K+3} |h'[j]| \quad h'[j] = 0 \quad n > M \text{ or } n < 0$$

wherein $\alpha'[k]$ represents a sum for a step size $\alpha$ at a tap position k, h'[j] is the impulse response coefficients of the adaptive filter generated during the training mode, M is the number of coefficients in the adaptive filter, and n represents coefficient values, and the respective step sizes $\alpha[k]$ are generated according to the following equation:

$$\alpha[k] = (2\alpha'[k])/(\max(\alpha'(k)))$$

wherein $\alpha'[k]$ represents a step size $\alpha$ at a tap position k.

19. The handsfree telephone as defined in claim 18, wherein further including a circuit for injecting a training signal to the echo canceller and the speaker in a training mode, and wherein the respective step sizes are generated from respective coefficients generated in the training mode.

* * * * *